(12) United States Patent
Hyun et al.

(10) Patent No.: US 7,211,485 B2
(45) Date of Patent: May 1, 2007

(54) METHOD OF FABRICATING FLASH MEMORY DEVICE AND FLASH MEMORY DEVICE FABRICATED THEREBY

(75) Inventors: Kwang-Wook Hyun, Incheon (KR); Jae-Won Um, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 230 days.

(21) Appl. No.: 10/958,117

(22) Filed: Oct. 4, 2004

(65) Prior Publication Data
US 2005/0124117 A1   Jun. 9, 2005

(30) Foreign Application Priority Data
Dec. 9, 2003   (KR) .................. 10-2003-0089156

(51) Int. Cl.
*H01L 21/336*   (2006.01)
*H01L 21/8239*  (2006.01)

(52) U.S. Cl. .................. 438/257; 438/259; 438/267; 438/593; 257/315; 257/330; 257/E29.3; 257/E29.129

(58) Field of Classification Search ............. 438/201, 438/211, 218, 225, 257, 259, 267, 424, 430, 438/431, 432, 593; 257/330, 332, 314, 315, 257/E29.3, E29.129
See application file for complete search history.

(56) References Cited

U.S. PATENT DOCUMENTS

| | | | | |
|---|---|---|---|---|
| 5,960,284 | A * | 9/1999 | Lin et al. | 438/259 |
| 6,136,648 | A * | 10/2000 | Oya | 438/257 |
| 6,159,801 | A * | 12/2000 | Hsieh et al. | 438/259 |
| 6,200,856 | B1 | 3/2001 | Chen | 438/257 |
| 6,235,589 | B1 * | 5/2001 | Meguro | 438/267 |
| 6,358,796 | B1 * | 3/2002 | Lin et al. | 438/257 |
| 6,362,048 | B1 * | 3/2002 | Huang | 438/257 |
| 6,376,877 | B1 * | 4/2002 | Yu et al. | 257/317 |

(Continued)

FOREIGN PATENT DOCUMENTS

JP         02-299476        11/2002

(Continued)

*Primary Examiner*—M. Wilczewski
(74) *Attorney, Agent, or Firm*—Mills & Onello LLP

(57) ABSTRACT

There are provided a method of fabricating a flash memory device and a flash memory device fabricated thereby. The method of fabricating a flash memory device includes forming an isolation layer defining an active region in a semiconductor substrate, wherein the isolation layer is formed to have a protrusion being higher than a top surface of the active region, and to provide a groove in the active region. A conductive layer pattern is formed in the groove. A buffer layer is formed on the semiconductor substrate having the conductive layer pattern. Then, an oxidation barrier layer pattern having a line shape opening across the active region is formed on the buffer layer. The buffer layer and an upper portion of the conductive layer pattern, which are exposed by the opening, are selectively oxidized to form a mask oxide layer at a cross region of the opening and the active region, and simultaneously to form a buffer oxide layer on the isolation layer adjacent to the mask oxide layer. The oxidation barrier layer pattern is removed. Using the mask oxide layer, the buffer oxide layer and the isolation layer as etch masks, the buffer layer and the conductive layer pattern are etched, so as to form a floating gate on the active region.

15 Claims, 10 Drawing Sheets

U.S. PATENT DOCUMENTS

| | | | |
|---|---|---|---|
| 6,475,894 B1 * | 11/2002 | Huang et al. | 438/593 |
| 6,486,508 B1 * | 11/2002 | Lee | 257/316 |
| 6,583,008 B2 * | 6/2003 | Lee et al. | 438/257 |
| 6,627,942 B2 | 9/2003 | Wang | 257/315 |
| 6,677,224 B2 * | 1/2004 | Tseng | 438/593 |
| 6,825,085 B2 * | 11/2004 | Chen et al. | 438/266 |
| 6,847,088 B2 * | 1/2005 | Yamada | 257/392 |
| 6,872,623 B2 * | 3/2005 | Chuang et al. | 438/257 |
| 6,878,987 B2 * | 4/2005 | Lee et al. | 257/315 |
| 6,890,820 B2 * | 5/2005 | Yoon et al. | 438/257 |
| 6,912,708 B2 * | 6/2005 | Wallman et al. | 717/128 |
| 6,921,964 B2 * | 7/2005 | Furuhata et al. | 257/637 |
| 6,995,062 B2 * | 2/2006 | Chen et al. | 438/257 |
| 7,001,809 B2 * | 2/2006 | Hsieh et al. | 438/259 |
| 7,026,685 B2 * | 4/2006 | Furuhata | 257/316 |
| 7,030,444 B2 * | 4/2006 | Tu et al. | 257/315 |
| 7,115,470 B2 * | 10/2006 | Park et al. | 438/257 |
| 2002/0115254 A1 * | 8/2002 | Furuhata | 438/257 |
| 2005/0112828 A1 * | 5/2005 | Chu et al. | 438/296 |
| 2005/0158975 A1 * | 7/2005 | Liu et al. | 438/593 |

FOREIGN PATENT DOCUMENTS

KR            01-36044            5/2001

* cited by examiner

METHOD OF FABRICATING FLASH MEMORY DEVICE AND FLASH MEMORY DEVICE FABRICATED THEREBY

CROSS-REFERENCE TO RELATED APPLICATION

This application claims the benefit of Korean Patent Application No. 2003-89156, filed Dec. 9, 2003, the contents of which are hereby incorporated herein by reference in their entirety.

BACKGROUND

1. Technical Field

The present invention relates to a method of fabricating a semiconductor device and a semiconductor device fabricated thereby, and more particularly, to a method of fabricating a flash memory device and a flash memory device fabricated thereby.

2. Discussion of the Related Art

A flash memory device is a non-volatile memory device capable of erasing or programming information electrically, and is widely used as a memory device of electronic appliances such as computers, digital cameras, or the like. The flash memory device has two gates, that is, a floating gate used as a charge storage layer, and a control gate for controlling input and output signals. Further, in accordance with the structures of the floating gate and the control gate, it can be classified as a stack gate flash memory device or a split gate flash memory device.

The fabrication of a highly-integrated semiconductor device having a stack structure involves a number of photolithography processes. However, with the increased demand in high integration of semiconductor devices, the photolithography process requires solutions to solve the limitation of resolution and interlayer misalignment. For example, in the process of forming a floating gate of the flash memory device, the floating gate needs to be exactly aligned to the active region of the semiconductor substrate. However, as described above, it is difficult to form a floating gate of a desired shape due to the limitation of the photolithography process, and furthermore, there may occur a misalignment with an active region under the floating gate. Because of this, there occurs a problem of deteriorating the cell characteristics in each cell of the flash memory device, i.e., a length of a channel under the floating gate is short, or the channel is not generated at all. As efforts to overcome the problems, various methods have been introduced to align the floating gate with the active region of the semiconductor substrate.

A method of fabricating a conventional flash memory device to form a self-aligned floating gate on the active region of the semiconductor substrate is disclosed in U.S. Pat. No. 6,627,942.

FIG. 1 is a sectional view showing a method of fabricating a conventional flash memory device disclosed in the above U.S. Pat. No. 6,627,942.

Referring to FIG. 1, an isolation layer 104 confining an active region 102 is formed in a semiconductor substrate 100. The isolation layer 104 is formed by a shallow trench isolation (STI) process, and has a protrusion being higher than the surface of the semiconductor substrate 100 to have a step_difference with the surface of the semiconductor substrate 100. Then, a gate oxide layer 106 is formed on the active region 102. After forming a polysilicon layer on the entire surface of the semiconductor substrate 100 having the gate oxide layer 106, a chemical mechanical polishing (CMP) process is performed. As a result, a self-aligned polysilicon layer pattern 108 is formed on the active region 102. The polysilicon layer pattern 108 is used as a floating gate of the flash memory device.

As described above, in the method of fabricating a conventional flash memory device, a self-aligned floating gate can be formed in the active region. However, a problem may be caused in a subsequent process of forming an oxide layer in the method described as above. For example, in the method of fabricating a split gate flash memory device, a polysilicon oxide layer is formed on the polysilicon layer pattern 108 by a thermal oxidation process after forming the polysilicon layer pattern 108. During the process, an interface B between the isolation layer 104 and the polysilicon layer pattern 108 can be used as a diffusion path of oxygen. As a result, there may occur a smile effect in which a thickness of the gate oxide layer 106 adjacent to the interface B is thick. By the smile effect, since the thickness of the gate oxide layer 106 is non-uniform, the electrical characteristics of each cell of the split gate flash memory device may be deteriorated.

SUMMARY OF THE INVENTION

Therefore, one feature of the present invention is to provide a method of fabricating a flash memory device for avoiding non-uniform thickness of a gate oxide layer under a floating gate when forming a self-aligned floating gate on an active region of a semiconductor substrate.

Another feature of the present invention is to provide a flash memory device fabricated by the method of fabricating a flash memory device.

In one aspect, the invention is directed to a method of fabricating a flash memory device. In accordance with the method of the invention, an isolation layer defining an active region in a semiconductor substrate is formed. The isolation layer is formed to have a protrusion higher than a top surface of the active region, and to provide a groove in the active region. A conductive layer pattern is formed in the groove. A buffer layer is formed on the semiconductor substrate having the conductive layer pattern. An oxidation barrier layer pattern having a line-shape opening across the active region is formed on the buffer layer. The buffer layer and an upper portion of the conductive layer pattern, which are exposed by the opening, are selectively oxidized to form a mask oxide layer at a cross region of the opening and the active region, and simultaneously to form a buffer oxide layer on the isolation layer adjacent to the mask oxide layer. The oxidation barrier layer pattern is removed. Using the mask oxide layer, the buffer oxide layer and the isolation layer as etch masks, the buffer layer and the conductive layer pattern are etched, so as to form a floating gate on the active region.

In one embodiment, the isolation layer is formed with shallow trench isolation (STI) structure.

The method can further include forming a gate oxide layer on the active region after forming the isolation layer.

The conductive layer pattern can be formed of polysilicon.

In one embodiment, forming the conductive layer pattern comprises: forming a conductive layer on the semiconductor substrate having the isolation layer; and performing CMP on the conductive layer to expose the isolation layer. In one embodiment, the conductive layer is formed of polysilicon.

In one embodiment, forming the conductive layer pattern comprises: forming a conductive layer on the semiconductor substrate having the isolation layer; and performing an etch back process on the conductive layer to expose an upper surface of the isolation layer and simultaneously to form the conductive layer pattern on the active region, wherein the etch back process is performed such that an upper surface of the conductive layer pattern is lower than the upper surface of the isolation layer, and has a recessed profile. The conductive layer can be formed of polysilicon.

In one embodiment, forming the conductive layer pattern comprises: forming a conformal first conductive layer on the entire surface of the semiconductor substrate having the isolation layer; performing an etch back process on the conductive layer to form conductive layer spacers covering sidewalls of the protrusion of the isolation layer; forming a conformal second conductive layer on the entire surface of the semiconductor substrate having the conductive layer spacers; and performing a CMP or etch back process on the second conductive layer to expose the isolation layer. The first and the second conductive layers can be formed of polysilicon.

In one embodiment, the buffer layer is formed of a polysilicon layer.

In one embodiment, the oxidation barrier layer pattern is formed of a silicon nitride layer.

In one embodiment, forming the oxidation barrier layer pattern comprises: forming an oxidation barrier layer on the buffer layer; forming a photoresist pattern on the oxidation barrier layer, wherein the photoresist pattern has an opening across the active region with a line shape; and etching the oxidation barrier layer using the photoresist pattern as an etch mask. The oxidation barrier layer can be formed of a silicon nitride layer.

In one embodiment, the method further comprises: forming an inter-gate dielectric layer at least covering the exposed sidewalls of the floating gate after forming the floating gate; and forming a control gate on the resultant structure having the inter-gate dielectric layer, to overlap at least one side portion of the floating gate, and to cross the active region.

In accordance with another aspect, the invention is directed to a flash memory device. The flash memory device includes an isolation layer disposed in a semiconductor substrate to define an active region, wherein the isolation layer has a protrusion higher than the surface of the semiconductor substrate to provide a groove in the active region. A floating gate is disposed to have a recessed upper surface in the groove. A mask oxide layer is disposed on the floating gate aligned to the floating gate. A buffer oxide layer is disposed on the isolation layer connected to the mask oxide layer.

In one embodiment, the floating gate is a polysilicon layer.

In one embodiment, the mask oxide layer and the buffer oxide layer are polysilicon oxide layers.

The flash memory device can further comprise a gate oxide layer interposed at least between the floating gate and the semiconductor substrate of the active region.

The flash memory device can further comprise: an inter-gate dielectric layer at least covering sidewalls of the floating gate; and a control gate disposed across the active region, to overlap at least one-side portion of the floating gate.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
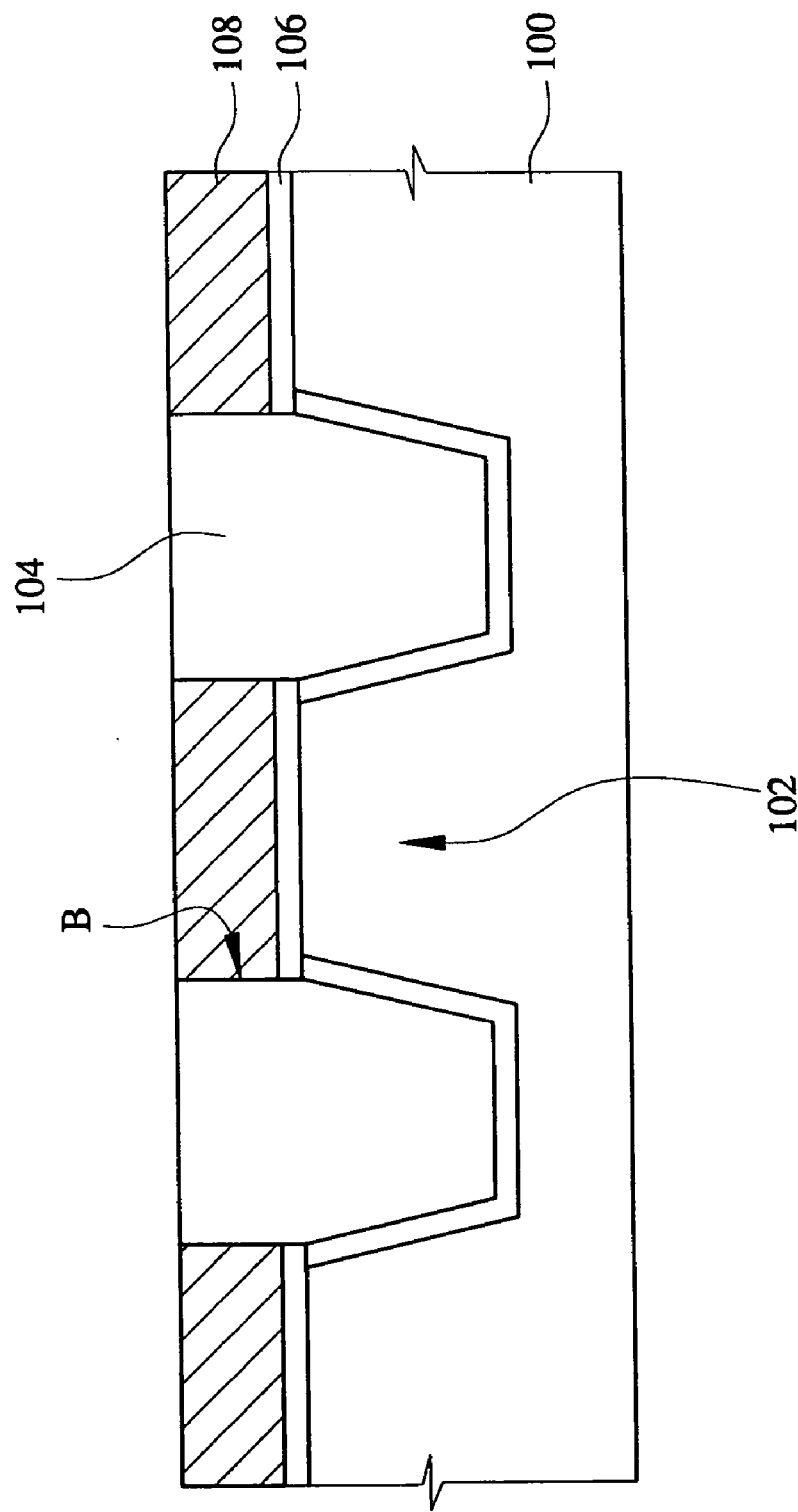
FIG. 1 is a sectional view showing a method of fabricating a conventional flash memory device.

The present invention will now be described more fully hereinafter with reference to the accompanying drawings, in which preferred embodiments of the invention are shown. In the drawings, the thickness of layers and regions are exaggerated for clarity.

Figure 2:
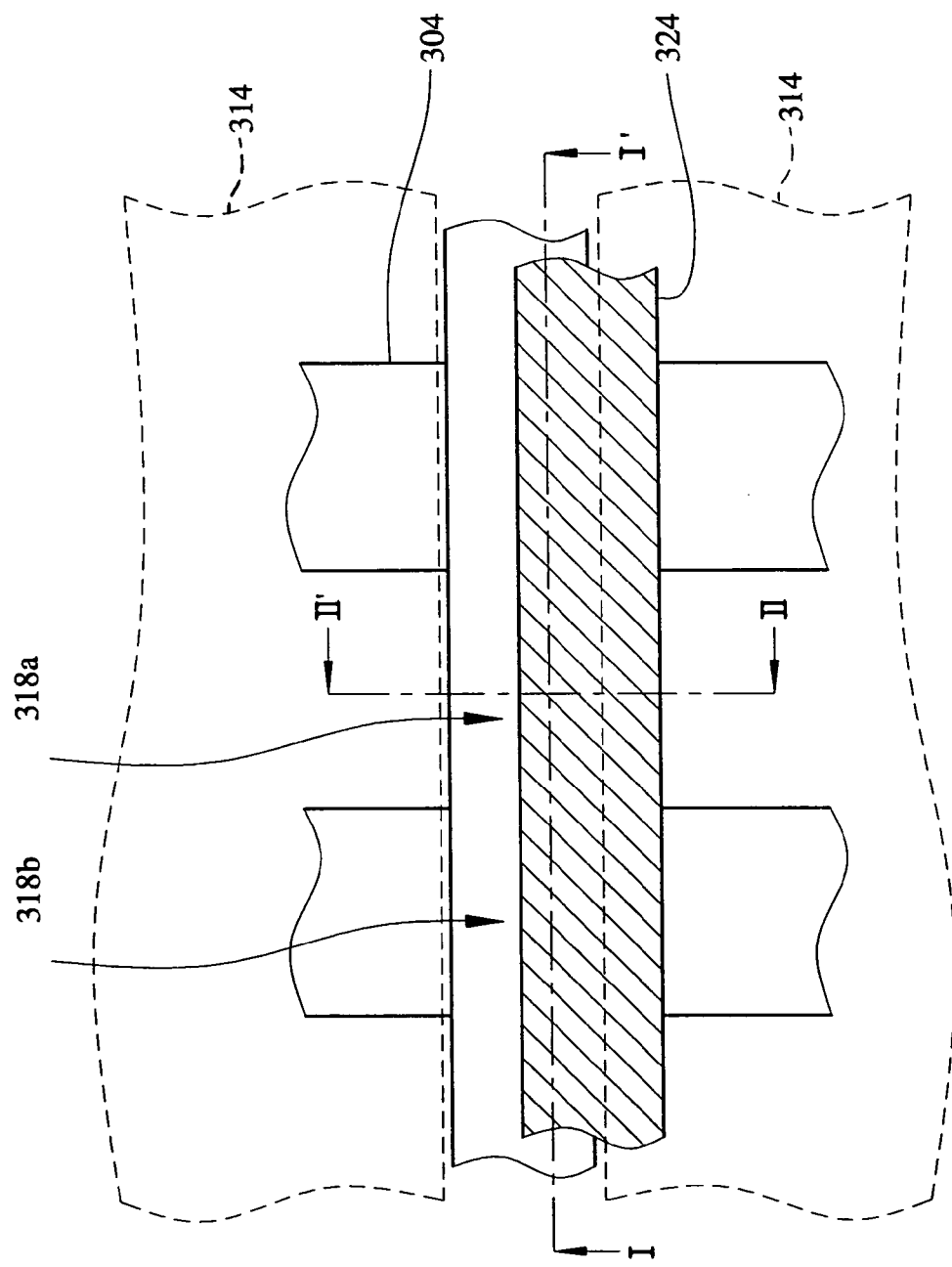
FIG. 2 is a plan view partially showing a split gate flash memory device according to embodiments of the present invention.

FIG. 2 is a plan view partially showing a split gate flash memory device according to embodiments of the present invention.

FIGS. 3 to 10B are sectional views showing a method of fabricating a split gate flash memory device according to a first embodiment of the present invention. In FIGS. 3 to 10B, FIGS. 3, 4, 5A, 6A, 7A, and 10A are sectional views taken along the line I~I' of FIG. 2, and FIGS. 5B, 6B, 7B, 8, 9, and 10B are sectional views taken along the line II~II' of FIG. 2.

Figure 3:
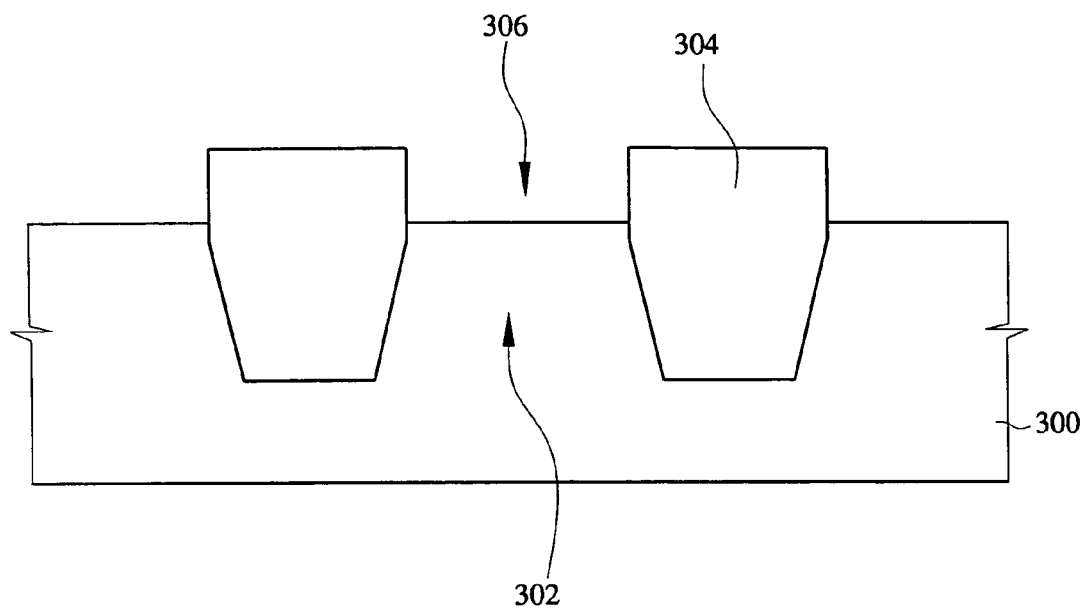
FIGS. 3 to 10B are sectional views showing a method of fabricating a split gate flash memory device according to a first embodiment of the present invention.

Referring to FIGS. 2 and 3, an isolation layer 304 defining an active region 302 is formed in a semiconductor substrate 300. The isolation layer 304 may be formed using an STI process. More specifically, a pad oxide layer and a hard mask layer are formed on the semiconductor substrate 300 in sequence. The pad oxide layer may be formed of a thermal oxide layer, and the hard mask layer may be formed of a silicon nitride layer. Then, performing a photolithography process, an insulating layer deposition process, and a CMP process, the isolation layer 304 is formed inside the semiconductor substrate 300. The isolation layer 304 may be formed of, for example, a high density plasma (HDP) oxide layer. Then, the hard mask layer remaining on the active region 302 is removed through a wet etch process using phosphoric acid. The isolation layer 304 is formed to have a protrusion being higher than the surface of the semiconductor substrate by the characteristics of the STI process. As a result, in the active region 302, there is formed a groove 306, which is defined by the protrusion of the isolation layers 304 as shown in FIG. 3.

Figure 4:
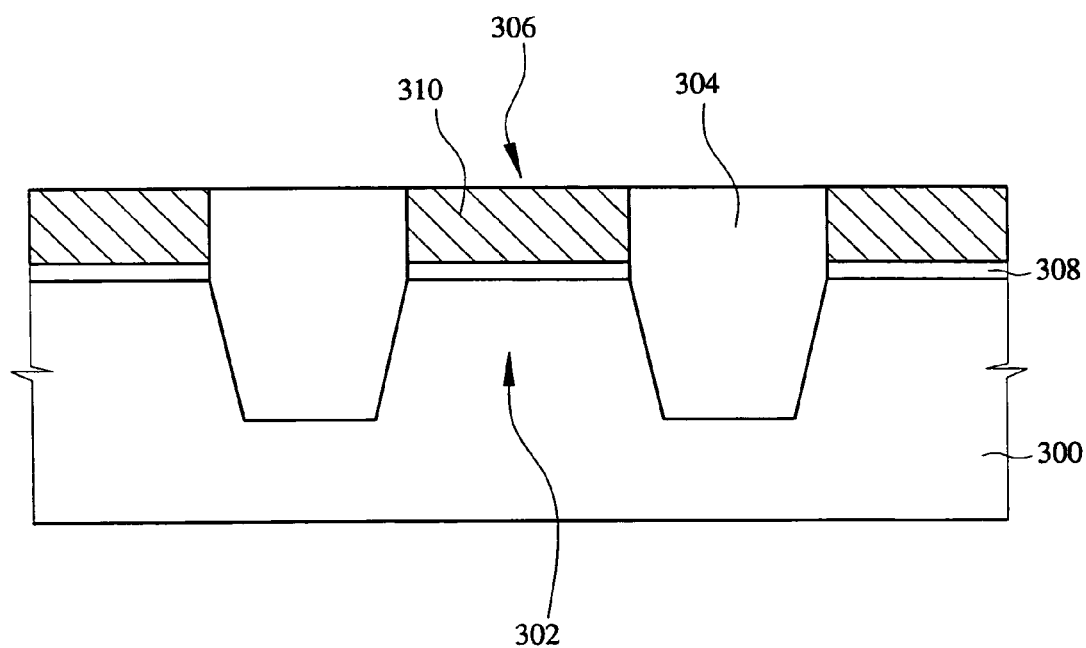

Referring to FIGS. 2 and 4, a gate oxide layer 308 is formed on the active region 302 after the isolation layer 304 is formed. The gate oxide layer 308 may be formed of a thermal oxide layer. Alternatively, the pad oxide layer remaining on the active region 302 is not removed during the formation process of the isolation layer 304, and may be used as the gate oxide layer 308. However, it is preferable to remove the pad oxide layer remaining on the active region 302 through a wet etch process and then to form the thermal oxide layer as described above. Then, a conductive layer (not shown) is formed on the entire surface of the semiconductor substrate 300 having the gate oxide layer 308 to fill the groove. The conductive layer may be formed of a polysilicon layer by a chemical vapor deposition (CVD) method. Then, performing a CMP process on the conductive layer such that the isolation layer 304 is exposed, there is formed a self-aligned conductive layer pattern 310 in the groove 306 on the active region 302.

Figure 5A:
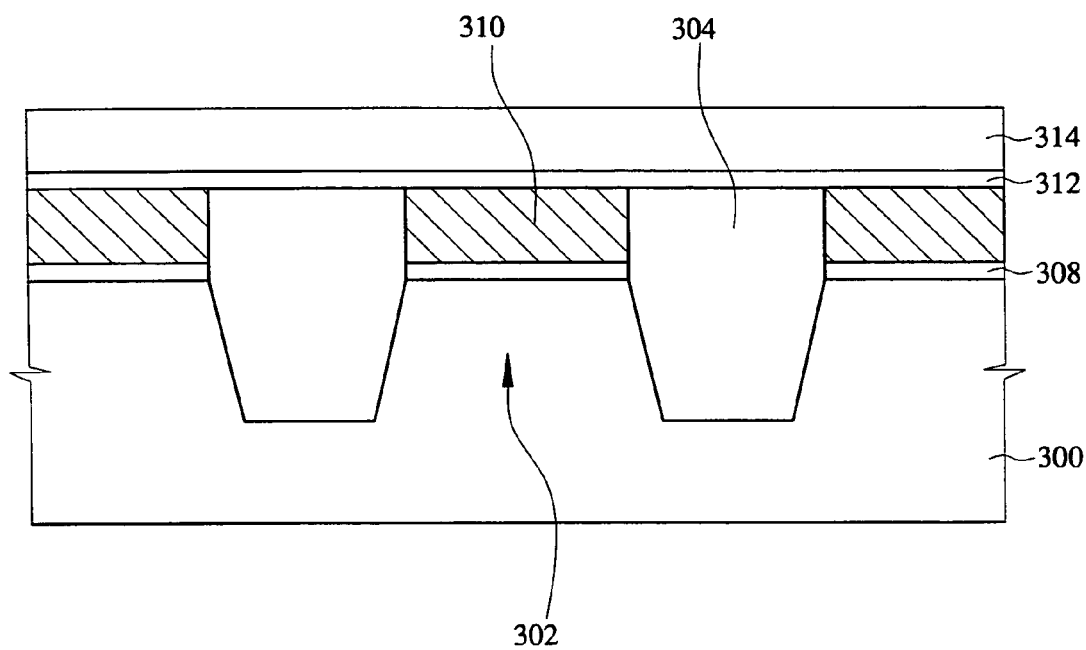
Figure 5B:
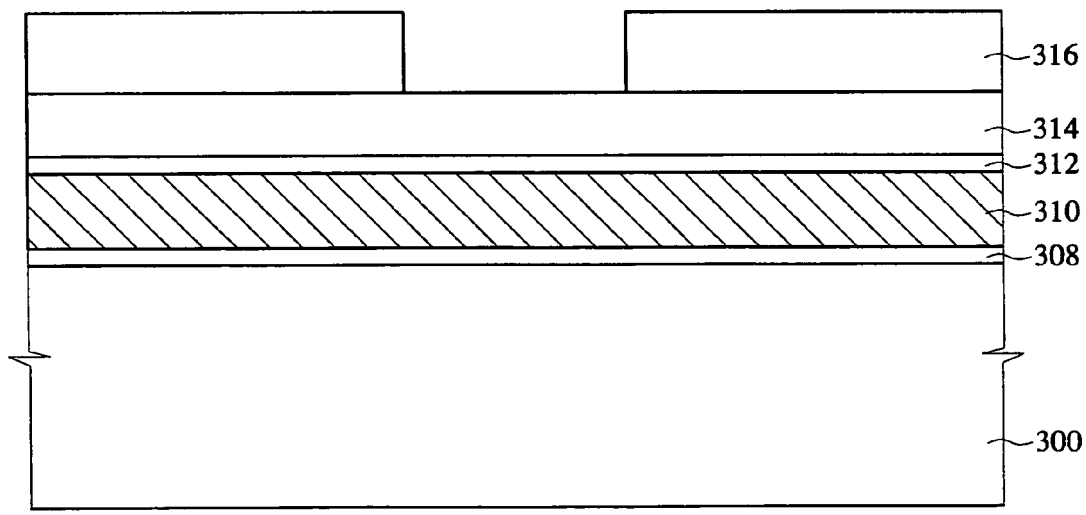

Referring to FIGS. 2, 5A and 5B, a buffer layer 312 is formed on the semiconductor substrate 300 having conductive layer patterns 310. In the embodiments of the present invention, the buffer layer 312 is formed of a polysilicon layer by a CVD method. For example, the polysilicon layer may be formed by a low pressure chemical vapor deposition (LPCVD) method using a silane ($SiH_4$) gas as a silicon source at a temperature of 400~650° C. Then, an oxidation barrier layer 314 is formed on the buffer layer 312. The oxidation barrier layer 314 may be formed of a silicon nitride layer.

For example, the silicon nitride layer may be formed of an LPCVD method using dichlorosilane ($SiCl_2H_2$) and ammonia ($NH_3$) as a reactant gas. Then, a photoresist pattern 316 is formed on the oxidation barrier layer 314. The photoresist pattern 316 is formed to have opening in line shape across the active region 302.

Figure 6A:
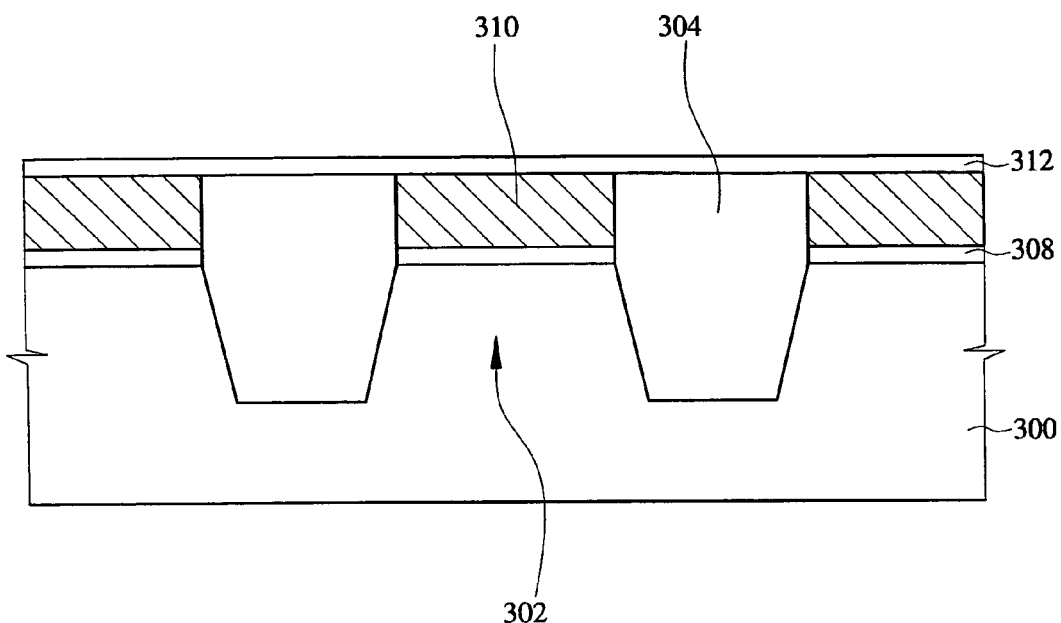
Figure 6B:
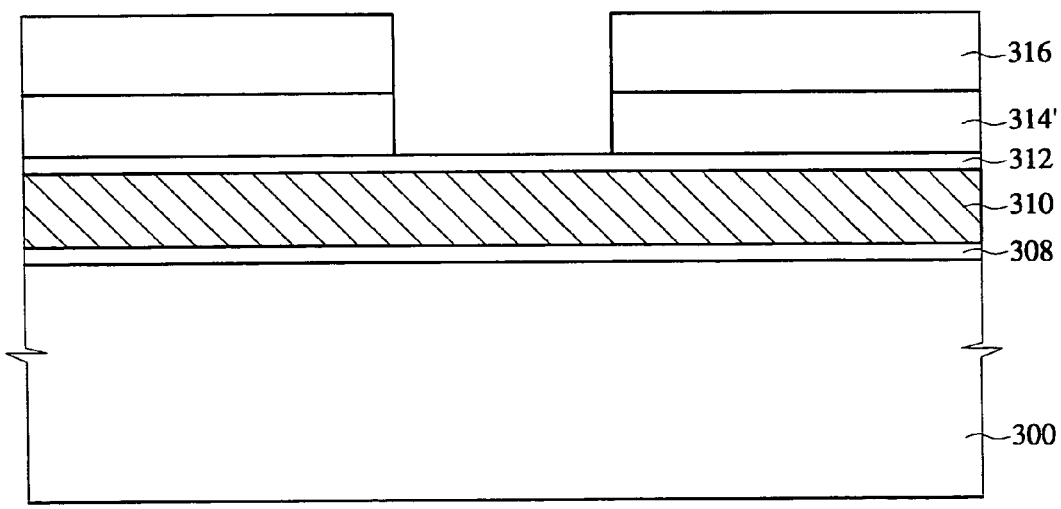

Referring to FIGS. 2, 6A and 6B, the oxidation barrier layer 314, which is exposed by the photoresist pattern 316, is removed by an anisotropic etch process using the photoresist pattern 316 as an etch mask. As a result, the buffer layer 312 under the oxidation barrier layer 314 is exposed, and at the same time, there is formed an oxidation barrier layer pattern 314', which remains under the photoresist pattern 316. That is, the oxidation barrier layer pattern 314' is formed to have opening in line shape across the active region 302 like the photoresist pattern 316.

Figure 7A:
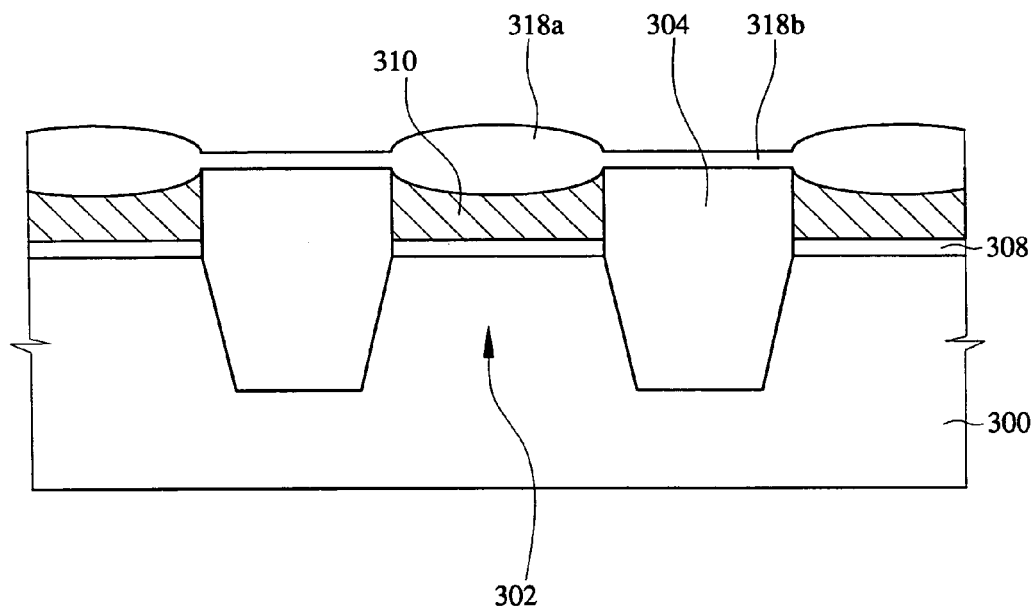
Figure 7B:
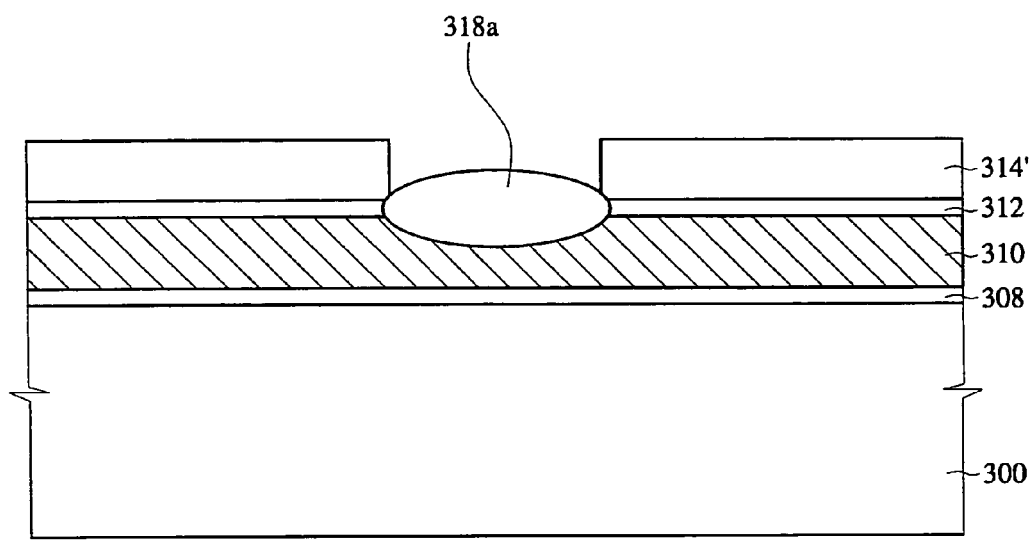

Referring to FIGS. 2, 7A and 7B, the photoresist pattern 316 is removed. Then, using the oxidation barrier layer pattern 314' as a mask, the exposed portion of the buffer layer 312 and the upper portion of the conductive layer patterns 310 under the buffer layer 312 are selectively oxidized. The oxidation process is preferably a thermal oxidation process performed at a temperature of 800~1,000° C. During the process, the buffer layer 312 functions to prevent a phenomenon in which oxygen penetrates through the interface between the isolation layer 304 and the conductive layer patterns 310, and the gate oxide layer 308 adjacent to the isolation layer 304 becomes thick. As a result of performing the thermal oxidation process, a mask oxide layer 318a is formed at a cross region of the opening formed by the oxidation barrier layer pattern 314' and the active region 302. That is, a mask oxide layer 318a is formed in the upper portion of the conductive layer patterns 310, which is exposed by the oxidation barrier layer pattern 314'. At the same time, a buffer oxide layer 318b is formed on the isolation layer 304, which is exposed by the oxidation barrier layer pattern 314', connected to the mask oxide layer 318a. In the embodiment of the present invention, the mask oxide layer 318a and the buffer oxide layer 318b are polysilicon oxide layers. Preferably, the thermal oxidation process may be performed enough such that the buffer layer 312 on the isolation layer 304 is completely oxidized, and the conductive layer patterns 310 at both sides of the isolation layer 304 are separated from each other.

Figure 8:
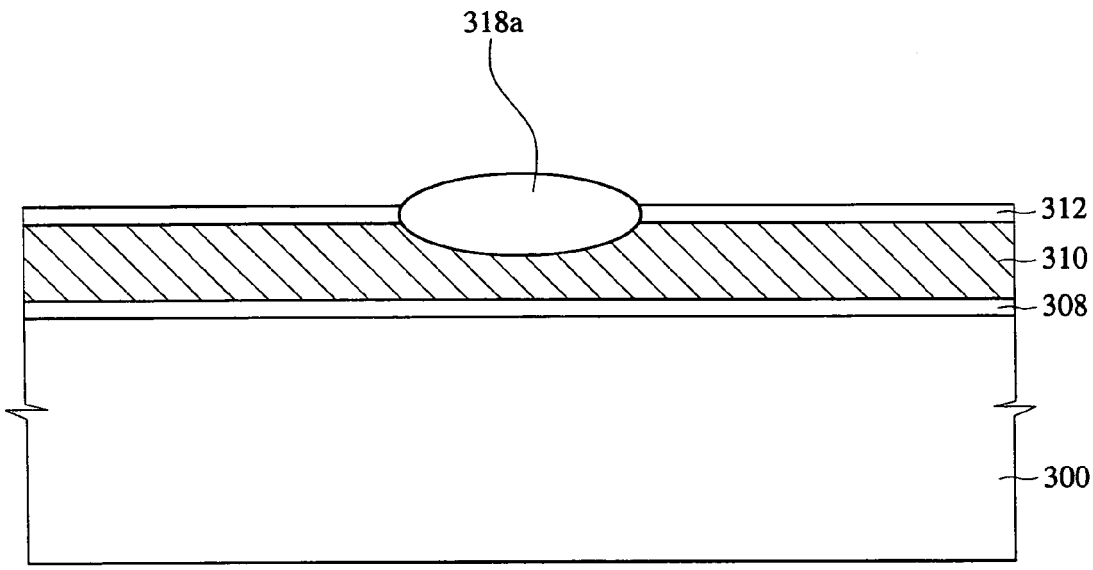

Referring to FIGS. 2 and 8, after the mask oxide layer 318a and the buffer oxide layer 318b are formed, the oxidation barrier layer pattern 314', which has been used as a mask, is removed. As a result, the buffer layer 312 under the oxidation barrier layer pattern 314' is exposed. In the embodiments of the present invention, the oxidation barrier layer pattern 314' is formed of a silicon nitride layer, and may be removed by a wet etch process using phosphoric acid as an etch solution.

Figure 9:
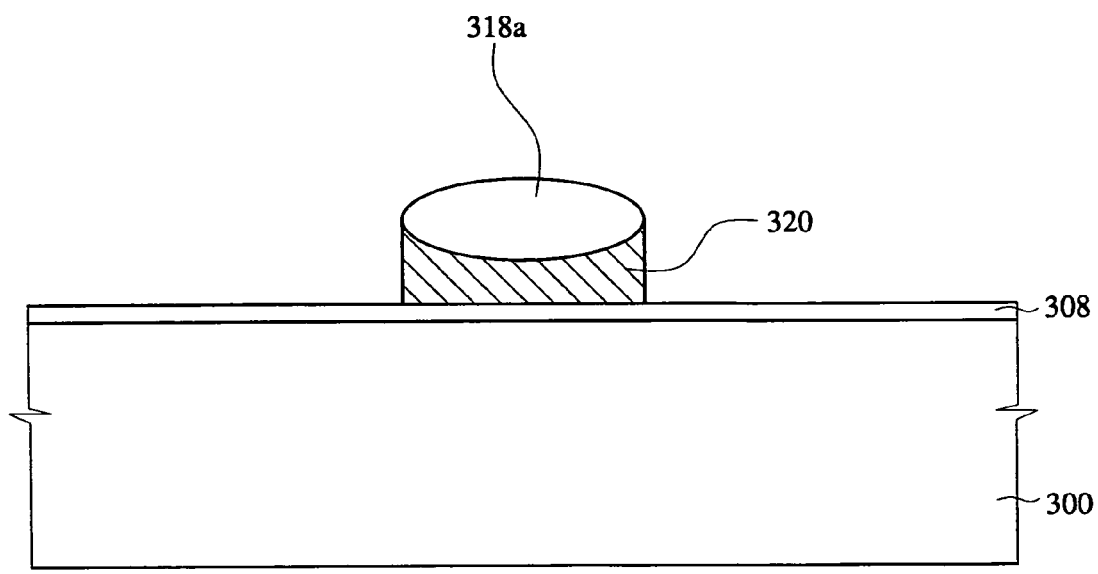

Referring to FIGS. 2 and 9, after the oxidation barrier layer pattern 314' is removed, using the mask oxide layer 318a, the isolation layer 304, and the buffer oxide layer 318b as etch masks, the buffer layer 312 and the conductive layer pattern 310 are sequentially removed by an anisotropic process. As a result, floating gates 320, which are self-aligned to the mask oxide layer 318a, are formed on the active region 302.

According to the embodiments of the present invention, as described above, the conductive layer patterns 310 are formed self-aligned on the active region 302. Then, after the mask oxide layer 318a is selectively formed in upper portion of the conductive layer patterns 310, there is formed a floating gate 320 being self-aligned to the mask oxide layers 318a. Therefore, the split gate flash memory device according to the embodiments of the present invention has the self-aligned floating gate 320 on the active region 302, thereby solving the problem caused by a misalignment of the floating gate 320. Further, the buffer layer 312 is formed the conductive layer pattern 310 and the isolation layer 304, thereby preventing a phenomenon that the gate oxide layer 308 is locally thick during the formation process of the mask oxide layer 318a.

Figure 10A:
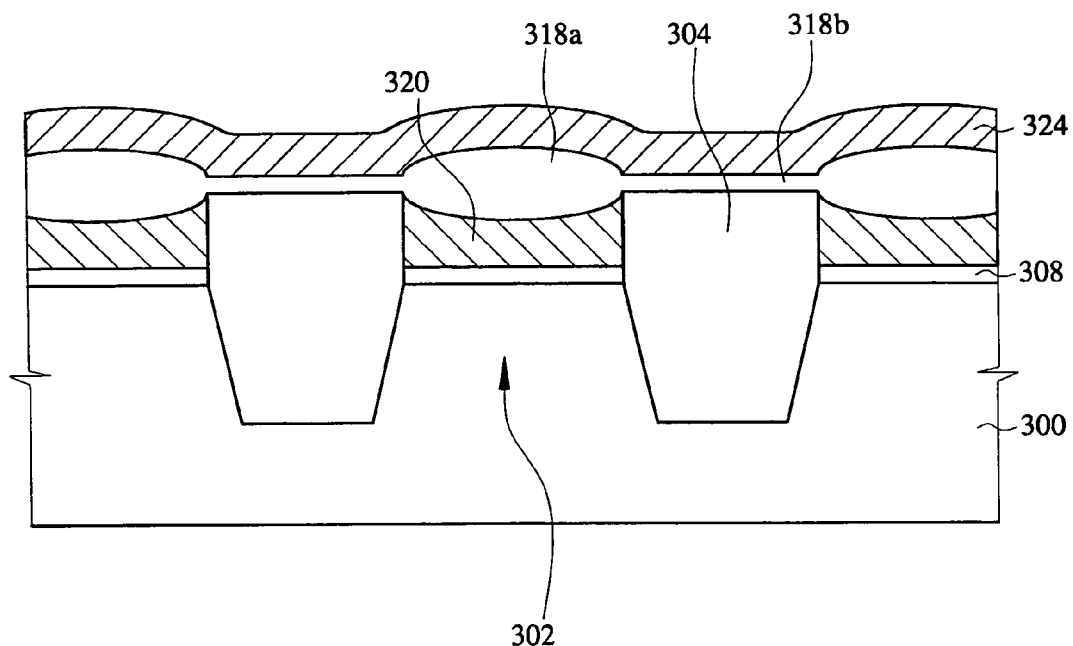
Figure 10B:
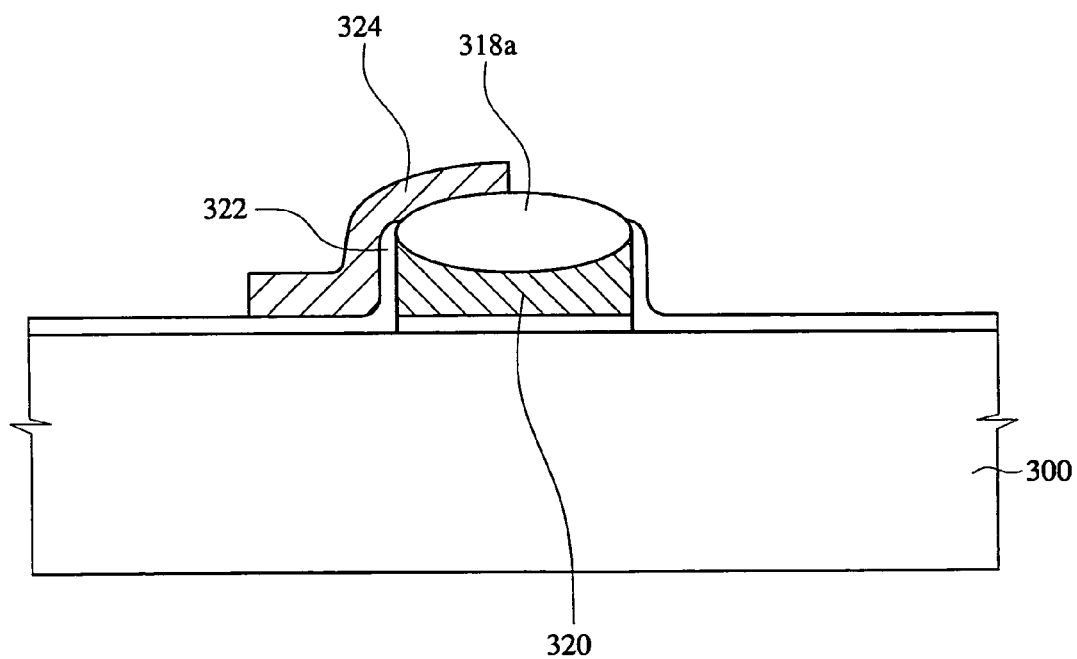

Then, referring to FIGS. 2, 10A, and 10B, after the floating gate 320 is formed, there is formed an inter-gate dielectric layer 322 at least covering sidewalls of the floating gate 320. The inter-gate dielectric layer 322 may be formed of a thermal oxide layer. Further, the inter-gate dielectric layer 322 may be conformally formed on the entire surface of the semiconductor substrate having the floating gate 320 using a CVD method. Then, a conformal polysilicon layer is formed on the substrate portion having the inter-gate dielectric layer 322. Then, patterning the polysilicon layer, a control gate 324 is formed across the active region 302, to overlap at least one side portion of the floating gate 320.

Figure 11:
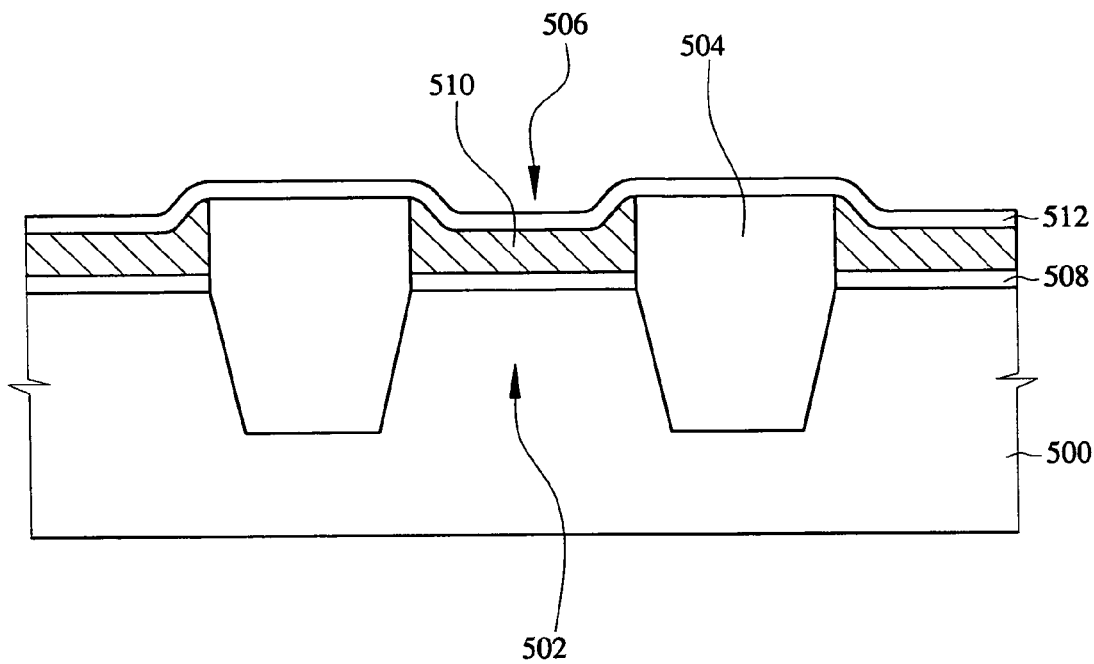
FIGS. 11 and 12 are sectional views showing a method of fabricating a split gate flash memory device according to a second embodiment of the present invention.
Figure 12:
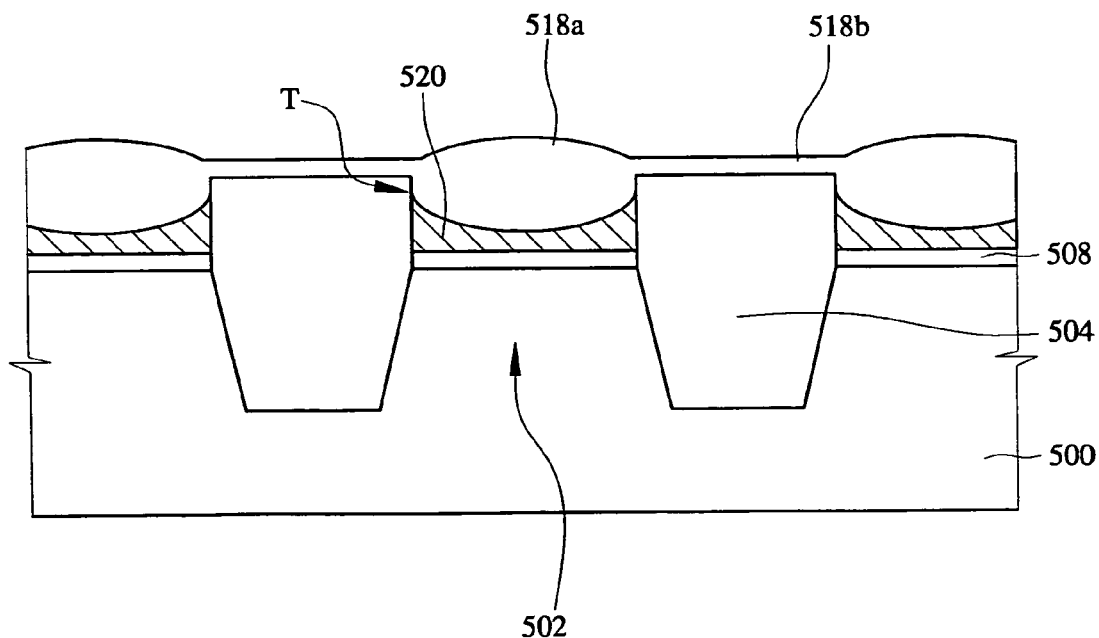

FIGS. 11 and 12 are sectional views showing a method of fabricating a split gate flash memory device according to a second embodiment of the present invention.

Referring to FIG. 11, performing the same process as the first embodiment of the present invention, there is formed an isolation layer 504 defining an active region 502 in a semiconductor substrate 500. Further, a groove 506 is formed in the active region 502 by protrusions of the isolation layer 504. Then, a gate oxide layer 508 is formed on the active region 502. A conductive layer (not shown) is formed on the semiconductor substrate 500 having the gate oxide layer 508. The conductive layer may be formed of a polysilicon layer. Then, an etch-back process is performed on the conductive layer to expose the isolation layer 504. As a result, in the groove 506, there is formed a conductive layer pattern 510, being lower than the upper surface of the isolation layer, and having a recessed profile at its upper surface. Then, a buffer layer 512 is formed on the semiconductor substrate 500 having the conductive layer pattern 510. The buffer layer 512 may be formed of a polysilicon layer.

Referring to FIG. 12, after the buffer layer 512 is formed, performing the same process as the first embodiment of the present invention, mask oxide layer 518a, buffer oxide layer 518b, and floating gate 520 are formed, and performing the remaining processes, a split gate flash memory device is formed. As described above, the conductive layer pattern 510 is formed to have a recessed upper portion. Thus, the floating gate 520, formed through a thermal oxidation process of forming the mask oxide layer 518a, may have tips T at its both sidewall ends, which are sharper than those of the floating gate 320 formed in the first embodiment of the present invention. As a result, the split gate flash memory device according to the second embodiment of the present invention has more improved erasing characteristics.

Figure 13:
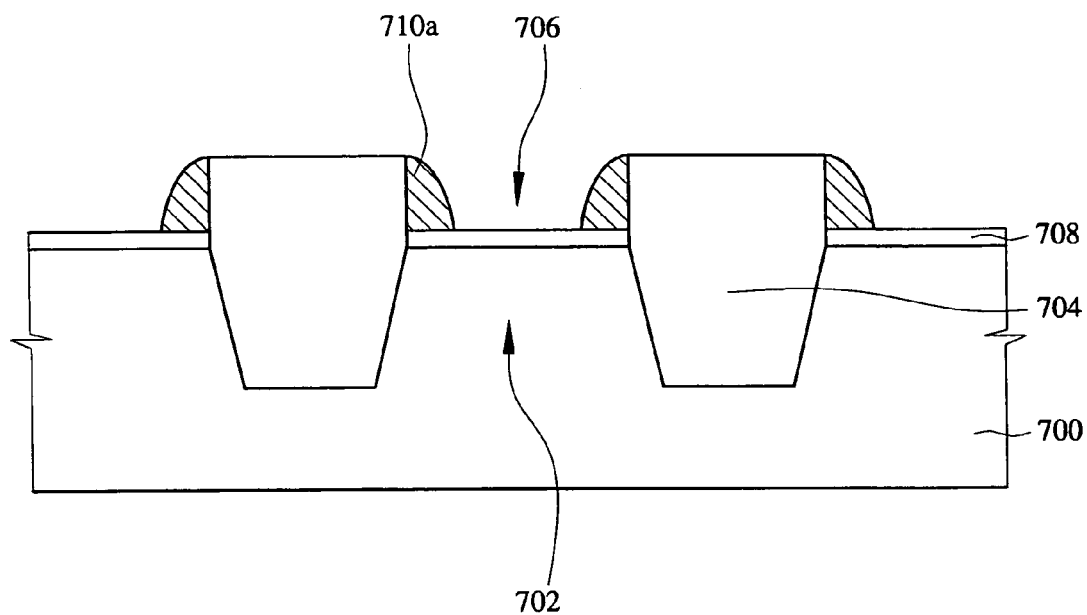
FIGS. 13 and 14 are sectional views showing a method of fabricating a split gate flash memory device according to a third embodiment of the present invention.
Figure 14:
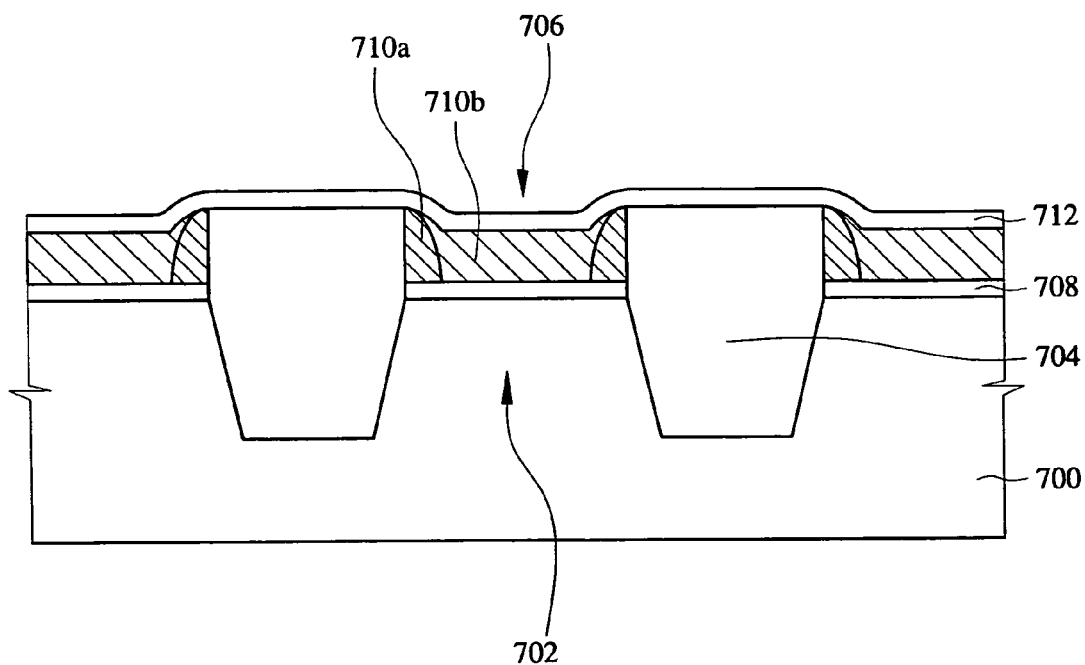

FIGS. 13 and 14 are sectional views showing a method of fabricating a split gate flash memory device according to a third embodiment of the present invention.

Referring to FIG. 13, performing the same process as the first embodiment of the present invention, an isolation layer 704 defining an active region 702 is formed in a semiconductor substrate 700. Further, a groove 706 is formed in the active region 702, defined by the protrusions of the isolation layer 704. A gate oxide layer 708 is formed on the active region 702. A conformal first conductive layer (not shown) is formed on the entire surface of the semiconductor substrate 700 having the gate oxide layer 708. The first conductive layer may be formed of a polysilicon layer. Then, performing an etch back on the first conductive layer, there are formed conductive layer spacers 710a for covering the sidewalls of the isolation layer 704.

Referring to FIG. 14, a conformal second conductive layer (not shown) is formed on the entire surface of the semiconductor substrate 700 having the conductive layer spacers 710a. The second conductive layer may be formed of a polysilicon layer. Then, a CMP or etch back is performed on the second conductive layer to expose the isolation layer 704. As a result, a second conductive layer pattern 710b is formed in the remaining portion of the groove 706 after the conductive layer spacers 710a are filled therein, with its upper portion recessed as shown in FIG. 14. Then, a buffer layer 712 is formed on the semiconductor substrate 700 having the second conductive layer pattern 710b. Performing the same process as the first embodiment of the present invention, there is formed a split gate flash memory device. According to the third embodiment of the present invention as described above, there is formed the second conductive layer pattern 710b having the recessed upper surface, thereby providing a floating gate having sharp sidewall tips as the second embodiment.

Now hereinafter, referring to FIGS. 2, 10A and 10B, a split gate flash memory device fabricated by the embodiments of the present invention will be described.

An isolation layer 304 defining an active region 302 is disposed in a semiconductor substrate 300. The isolation layer 304 has a protrusion higher than the surface of the semiconductor substrate. A groove 306 is defined over the active region 302 by the protrusions of the isolation layer 304. A floating gate 320 with a recessed upper surface is disposed in the groove 306. The floating gate 320 may be a polysilicon layer. A gate oxide layer 308 is interposed between at least the floating gate 320 and the semiconductor substrate of the active region 302. On the floating gate 320, there is disposed a mask oxide layer 318a aligned to the floating gate 320. Further, a buffer oxide layer 318b is disposed on the isolation layer 304 adjacent to the mask oxide layer 318a, connected to the mask oxide layer 318a. In the embodiment of the present invention, the mask oxide layer 318a and the buffer oxide layer 318b may be polysilicon oxide layers. Further, there is formed an inter-gate dielectric layer 322 for covering the exposed sidewalls of at least the floating gate 320. The inter-gate dielectric layer 322 may be a thermal oxide layer. A control gate 324 is formed to overlap at least one side portion of the floating gate 320, across the active region 302. The control gate 324 may be a polysilicon layer.

As described above, according to the present invention, a flash memory device can be provided to prevent a thickness of the gate dielectric layer under the floating gate being non-uniform when forming the self-aligned floating gate on the active region. Further, since the floating gate is formed to have sharp sidewall tips, a flash memory device can be provided with improved erasing characteristics.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a flash memory device, the method comprising the steps of:
   forming an isolation layer defining an active region in a semiconductor substrate, wherein the isolation layer is formed to have protrusion higher than a top surface of the active region, and to provide a groove in the active region;
   forming a conductive layer pattern in the groove;
   forming a buffer layer on the semiconductor substrate having the conductive layer pattern;
   forming an oxidation barrier layer pattern having a line-shape opening across the active region on the buffer layer;
   selectively oxidizing the buffer layer and an upper portion of the conductive layer pattern, which are exposed by the opening, to form a mask oxide layer at a cross region of the opening and the active region, and simultaneously to form a buffer oxide layer on the isolation layer adjacent to the mask oxide layer;
   removing the oxidation barrier layer pattern; and
   etching the buffer layer and the conductive layer pattern using the mask oxide layer, the buffer oxide layer and the isolation layer as etch masks, so as to form a floating gate on the active region.

2. The method according to claim 1, wherein the isolation layer is formed with shallow trench isolation (STI) structure.

3. The method according to claim 1, further comprising a step of forming a gate oxide layer on the active region after forming the isolation layer.

4. The method according to claim 1, wherein the conductive layer pattern is formed of polysilicon.

5. The method according to claim 1, wherein forming the conductive layer pattern comprises:
   forming a conductive layer on the semiconductor substrate having the isolation layer; and
   performing CMP on the conductive layer to expose the isolation layer.

6. The method according to claim 5, wherein the conductive layer is formed of polysilicon.

7. The method according to claim 1, wherein forming the conductive layer pattern comprises:
   forming a conductive layer on the semiconductor substrate having the isolation layer; and
   performing an etch back process on the conductive layer to expose an upper surface of the isolation layer and simultaneously to form the conductive layer pattern on the active region, wherein the etch back process is performed such that an upper surface of the conductive layer pattern is lower than the upper surface of the isolation layer, and has a recessed profile.

8. The method according to claim 7, wherein the conductive layer is formed of polysilicon.

9. The method according to claim 1, wherein forming the conductive layer pattern comprises:
forming a conformal first conductive layer on the entire surface of the semiconductor substrate having the isolation layer;
performing an etch back process on the conductive layer to form conductive layer spacers covering sidewalls of the protrusion of the isolation layer;
forming a conformal second conductive layer on the entire surface of the semiconductor substrate having the conductive layer spacers; and
performing a CMP or etch back process on the second conductive layer to expose the isolation layer.

10. The method according to claim 9, wherein the first and the second conductive layers are formed of polysilicon.

11. The method according to claim 1, wherein the buffer layer is formed of a polysilicon layer.

12. The method according to claim 1, wherein the oxidation barrier layer pattern is formed of a silicon nitride layer.

13. The method according to claim 1, wherein forming the oxidation barrier layer pattern comprises:
forming an oxidation barrier layer on the buffer layer;
forming a photoresist pattern on the oxidation barrier layer, wherein the photoresist pattern has an opening across the active region with a line shape; and
etching the oxidation barrier layer using the photoresist pattern as an etch mask.

14. The method according to claim 13, wherein the oxidation barrier layer is formed of a silicon nitride layer.

15. The method according to claim 1, further comprising;
forming an inter-gate dielectric layer at least covering the exposed sidewalls of the floating gate after forming the floating gate; and
forming a control gate on the resultant structure having the inter-gate dielectric layer, to overlap at least one side portion of the floating gate and to cross the active region.

* * * * *